(12) United States Patent
Romano et al.

(10) Patent No.: US 11,881,408 B2
(45) Date of Patent: Jan. 23, 2024

(54) SYSTEM AND METHOD FOR FABRICATING PHOTONIC DEVICE ELEMENTS

(71) Applicant: Paul Scherrer Institut, Villigen PSI (CH)

(72) Inventors: Lucia Romano, Dottikon (CH); Konstantins Jefimovs, Tegerfelden (CH); Matias Kagias, Zurich (CH); Joan Vila Comamala, Ennetbaden (CH); Marco Stampanoni, Endingen (CH)

(73) Assignee: Paul Scherrer Institut, Villigen PSI (CH)

( * ) Notice: Subject to any disclaimer, the term of this patent is extended or adjusted under 35 U.S.C. 154(b) by 77 days.

(21) Appl. No.: 17/635,081

(22) PCT Filed: Jul. 28, 2020

(86) PCT No.: PCT/EP2020/071235
§ 371 (c)(1),
(2) Date: Feb. 14, 2022

(87) PCT Pub. No.: WO2021/028214
PCT Pub. Date: Feb. 18, 2021

(65) Prior Publication Data
US 2022/0293427 A1    Sep. 15, 2022

(30) Foreign Application Priority Data
Aug. 14, 2019 (EP) ..................................... 19191781

(51) Int. Cl.
*H01L 21/306* (2006.01)
*H01L 21/308* (2006.01)
(Continued)

(52) U.S. Cl.
CPC .... *H01L 21/30604* (2013.01); *B81C 1/00619* (2013.01); *G02B 5/1857* (2013.01);
(Continued)

(58) Field of Classification Search
None
See application file for complete search history.

(56) References Cited

U.S. PATENT DOCUMENTS

| 2012/0153250 A1 | 6/2012 | Modawar et al. |
| 2018/0090336 A1 | 3/2018 | Li et al. |

(Continued)

FOREIGN PATENT DOCUMENTS

| CN | 103553046 A | 2/2014 |
| JP | H10321895 A | 12/1998 |
| WO | 2014028903 A1 | 2/2014 |

OTHER PUBLICATIONS

Richard C Tiberio et al, "Vertical directionality-controlled metal-assisted chemical etching for ultrahigh aspect ratio nanoscale structures", Oct. 24, 2014 (Oct. 24, 2014), vol. 32, No. 6, p. 06FI01-1-06FI01-5, XP012191244, [retrieved on Jan. 1, 1901] abstract; figure 1.

(Continued)

*Primary Examiner* — Jiong-Ping Lu
(74) *Attorney, Agent, or Firm* — Laurence A. Greenberg; Werner H. Stemer; Ralph E. Locher

(57) ABSTRACT

Elements of photonic devices with high aspect ratio patterns are fabricated. A stabilizing catalyst that forms a stable metal-semiconductor alloy allows to etch a substrate in vertical direction even at very low oxidant concentration without external bias or magnetic field. A metal layer on the substrate reacts with the oxidant contained in air and catalyzes the semiconductor etching by the etchant. Air in continuous flow at the metal layer allows to maintain (Continued)

constant the oxidant concentration in proximity of the metal layer. The process can continue for a long time in order to form very high aspect ratio structures in the order of 10,000:1. Once the etched semiconductor structure is formed, the continuous air flow supports the reactant species diffusing through the etched semiconductor structure to maintain a uniform etching rate. The continuous air flow supports the diffusion of reaction by-products to avoid poisoning of the etching reaction.

9 Claims, 14 Drawing Sheets

(51) Int. Cl.
    *H01L 31/028*     (2006.01)
    *B81C 1/00*     (2006.01)
    *G02B 5/18*     (2006.01)
    *B82Y 20/00*     (2011.01)
    *B82Y 40/00*     (2011.01)
    *H01L 31/18*     (2006.01)
    *C09K 13/08*     (2006.01)

(52) U.S. Cl.
    CPC ........ *H01L 21/308* (2013.01); *H01L 21/3085* (2013.01); *H01L 21/3086* (2013.01); *H01L 31/028* (2013.01); *B82Y 20/00* (2013.01); *B82Y 40/00* (2013.01); *C09K 13/08* (2013.01); *G02B 5/1838* (2013.01); *H01L 31/1804* (2013.01); *Y02P 70/50* (2015.11)

(56) References Cited

U.S. PATENT DOCUMENTS

2019/0221438 A1*   7/2019   Li ................... H01L 21/30612
2022/0139717 A1*   5/2022   Sreenivasan ........... H01L 22/14
                                                                                         438/745

OTHER PUBLICATIONS

Owen J Hildreth et al, "Vapor Phase Metal-Assisted Chemical Etching of Silicon", Jun. 25, 2014 (Jun. 25, 2014), vol. 24, No. 24, p. 3827-3833, XP001590304, [retrieved on Mar. 14, 2014] the whole document.

Ya Hu et al., "Metal-Catalyzed Electroless Etching of Silicon in Aerated HF/H2O Vapor for Facile Fabrication of Silicon Nanostructures", pp. 1-6.

Ya Hu et al. "Metal-Catalyzed Electroless Etching of Silicon in Aerated HF/H2O Vapor for Facile Fabrication of Silicon Nanostructures", Nano Letter, American Chemical Society, US, vol. 14, No. 8, Jul. 18, 2014, pp. 4212-4219, XP009518164, ISSN: 1530-6984, DOI: 10.1021/NL50036U abstract, p. 4213, line 3; p. 4214; figures 2, 3; p. 4217 figure; 2014.

Kundu Pijus et al.: "In-situ tem study of highly stable oxygen nanobubbles in quasi-2D liquid system", 2018 IEEE Micro Electro Mechanical Systems (MEMS). IEEE, Jan. 21, 2018 (Jan. 21, 2018), pp. 1289-1292, XP033335828, DOI: 10.1109/MEMSYS.2018.8346801.

* cited by examiner

A)

B)

C)

D)

A)

side view

B)

top view without the holder

A)

side view

B)

top view without the holder

A) as dep.

100 nm

B) 250°C 100 nm

C) 300°C 100 nm

D) 350°C 100 nm

E) 400°C 100 nm

F) 450°C 100 nm

G) 500°C 100 nm

H) 550°C 100 nm

I) 600°C

1 μm

A)

B)

C)

2 μm

D)

1 μm

E)

10 μm

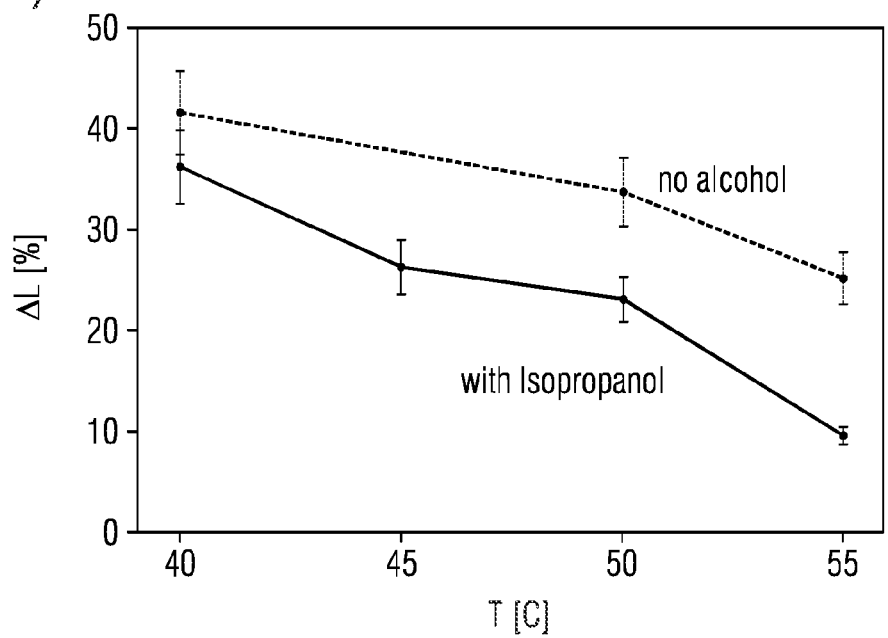

A)

B)

C)

D)

E)

F)

Formation of metal-semiconductor alloy
$PtSi-Pt_2Si$

G)

H)

$O_2 + 4H^+ + 4e^- \rightarrow 2H_2O$ $Si + 4HF \rightarrow SiF_4 + 4H^+ + 4e^-$

A)

B)

C)

D)

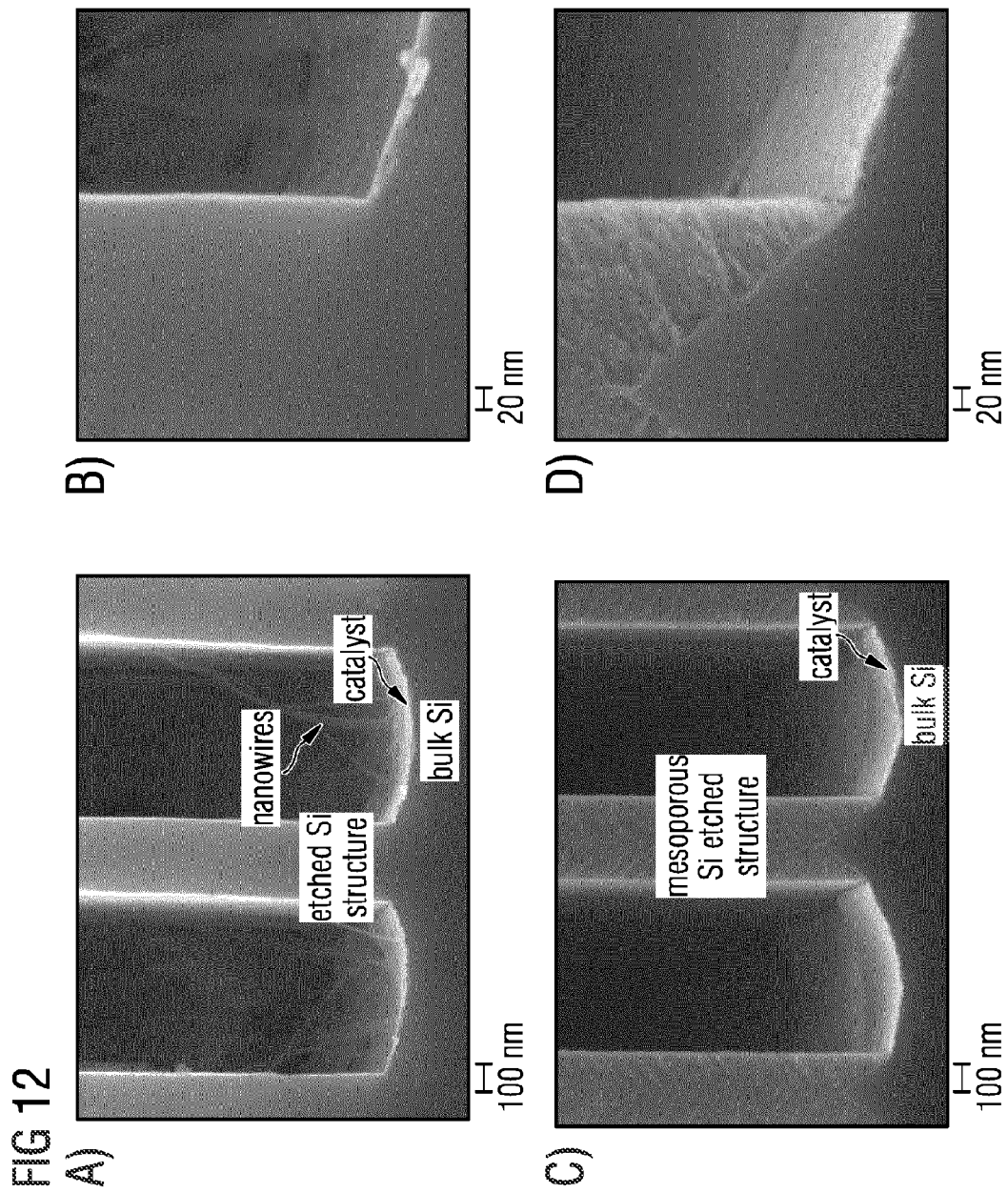

SYSTEM AND METHOD FOR FABRICATING PHOTONIC DEVICE ELEMENTS

FIELD AND BACKGROUND OF THE INVENTION

The present invention relates to a method to fabricate high aspect ratio patterns in a semiconductor substrate that are usable as elements of photonic devices.

Generally, photonic devices are components for creating, manipulating or detecting light. This can include laser diodes, light-emitting diodes, solar and photovoltaic cells, displays and optical amplifiers, diffractive patterns, periodic refractive and diffractive structures, gratings and lenses.

In this context, metal-assisted chemical etching (MacEtch) is a technique capable of fabricating 3D nano- and micro-structures of several shapes and applications such as nanoporous layers, nanowires, 3D objects, MEMS, microfluidic channels, Vias, X-ray optics, sensor devices in few semiconductors—Si, Ge, poly-Si, GaAs, SiC—and using different catalysts—Ag, Au, Pt, Pd, Cu, Ni, Rh. In typical MacEtch, a local electrochemical etching occurs when a metal patterned semiconductor substrate is immersed in a solution (the electrolyte) containing an etchant (e.g. HF) and an oxidant (e.g. $H_2O_2$). The metal serves as a catalyst for the $H_2O_2$ reduction with a consequent holes injection deep into the valence band of the semiconductor. The concentration of holes becomes higher in the region surrounding the metal catalyst, where the semiconductor is readily oxidized and removed by HF with the formation of reaction by-products such as silicon fluoride compounds. The reaction continues as the catalyst is pulled down into the substrate.

The same reaction can occur when electrolyte is evaporated and condensed on the surface of metal patterned silicon. It was demonstrated that the MacEtch reaction occurs at room temperature in presence of aerated HF in a similar fashion of metal corrosion by air. The oxygen diffusion through the condensed HF/water layer limits the etching rate and the maximum etched depth, so a maximum depth of 6 µm is etched in 3 hr. According to other sources, etchants can be evaporated from a liquid solution containing HF and $H_2O_2$ and adsorbed on the warmed substrate (35-60° C.), where a condensed thin layer is formed and the MacEtch reaction occurs. MacEtch in liquid phase demonstrated the capability to etch nanostructures with very high aspect ratio, such as nanowires, but as a wet etching technique it suffers of bending and agglomeration of structures during drying due to van der Waals forces and capillary forces between adjacent surfaces at the interface between liquid and air. The nanostructures agglomeration is highly undesirable and considered as a limiting factor for all the applications where the surface is directly related to the device efficiency, such as solar cells or sensing devices.

Indeed, large bundles prevent conformal coating, deteriorate the optical properties of an array of nanostructures, and may induce higher series resistance. Post etching drying steps are required to minimize the nanostructures agglomeration. For example, $CO_2$ based critical point drying shows excellent results, but it still requires extra processing steps and the use of high pressure and careful handling of the samples.

Patterning nanostructures requires high precision pattern transferring and high lateral resolution during growing or etching, with MacEtch in liquid this corresponds to a condition of very high HF concentration in the etching solution. Au catalyst suffers of bad adhesion on silicon substrates and a detrimental pattern peel-off has been reported during MacEtch in conditions of high HF concentration. On the other hand, uniform high aspect ratio have been reported for nanoporous Au catalyst in conditions of low HF concentration and high oxidant (e.g. $H_2O_2$) concentration. In these conditions the etching is more isotropic, top of the trenches appear wider with respect of bottom compromising the fidelity of pattern transfer in lateral dimension, so the process is not suitable for high aspect ratio nanostructures with high precision of pattern transfer.

It is necessary to perform the MacEtch in conditions of low oxidant concentration and very high HF concentration. Moreover, an effective catalyst must be chosen to maximize the etching rate, Pt has the faster reported etching rate for MacEtch due to its superior catalytic activity. The use of Pt as MacEtch catalyst has been mostly investigated in form of nanoparticles or added as top layer of Au thick film. Pt has the advantage of forming a stable silicide (PtSi and $Pt_2Si$) on Si surface at relatively low temperature, Pt silicide formation has been extensively reported in literature for the annealing temperature in the range of 400-600° C. A silicon oxide layer at the metal-substrate interface is usually a barrier layer for metal silicide formation, but Pt silicide has been reported to form also in presence of a native oxide layer. The formation of a top layer of $SiO_2$ is possible in case of annealing in oxidizing ambient.

The use of an interconnected metal pattern has been demonstrated to effectively reduce the off-vertical catalyst movement during MacEtch. Thermal de-wetting of thin platinum films offers a simple, low cost method of producing an etch mask for fabrication of semiconductor nanowires on a large area scale. De-wetting occurs when thin film on a solid substrate is heated, inducing clustering of the film. The film structure morphology (feature size, roughness, pores distribution) and the pattern evolution strongly depend on the film/substrate parameters (film material, film thickness, substrate material, defects) and the experimental conditions (deposition rate, annealing temperature, annealing environment etc).

Several research fields, such as X-ray optics, optical devices, microfluidics and bioengineering, thermoelectric materials, battery anodes, black silicon, solar cells, sensors and MEMS technology can take advantage of using MacEtch as nano- and micro-fabrication technique. In particular, MacEtch can have applications for the fabrication of X-ray optical elements such as gratings for grating based X-ray interferometry, zone plates, speckles for speckle based X-ray phase contrast imaging and other optical diffractive structures that can be used as elements of photonics devices.

With the rise of X-ray grating interferometry access to phase and scatter contrasts has been granted on conventional X-ray sources, thus facilitating the potential for medical and industrial applications. This is achieved by utilizing gratings with micrometer sized periods, that modulate the phase or the intensity of the X-rays. The key challenge faced at the moment is the fabrication of such gratings in order to deliver high contrast images over extended areas (at least 4-inch wafers). Taking into account that the phase or intensity modulation capabilities of the gratings are directly linked to their height/depth, for applications operating in the medical or industrial X-ray energy range high aspect ratios are required.

SUMMARY OF THE INVENTION

Therefore, the present invention has the objective to provide a method to fabricate high aspect ratio patterns in a semiconductor substrate that are elements of photonic devices, such as diffractive gratings. Photonic devices are components for creating, manipulating or detecting light. This can include laser diodes, light-emitting diodes, solar and photovoltaic cells, displays and optical amplifiers, diffractive patterns, periodic refractive and diffractive structures, gratings and lenses.

This objective is achieved according to the present invention by a method for fabricating photonic device elements by means of metal assisted chemical etching in gas phase, comprising the steps of:

(a) providing a semiconductor substrate and a patterned metal layer thereon;

(b) exposing the semiconductor substrate and the patterned metal layer thereon to reactants in gas phase, wherein the reactants comprise an oxidant gas and an etchant gas, wherein the oxidant gas comprises air and wherein the etchant gas comprises hydrofluoric acid, and wherein the said reactants are supplied in continuous or pulsed flow to the semiconductor substrate and the patterned metal layer thereon, wherein the concentration of oxygen in the said oxidant gas is locally increased by decomposing $H_2O_2$ on a platinum surface being a solid piece containing platinum immersed in a liquid solution containing $H_2O_2$, wherein the decomposition of $H_2O_2$ in liquid phase on the platinum surface produces $O_2$ in gas phase, wherein the said liquid solution is placed in a container and the liquid is not in contact with the semiconductor substrate and the patterned metal thereon.

Further, this objective is achieved according to the present invention by a method for fabricating photonic device elements by means of metal assisted chemical etching with reactants in liquid or gas phase, comprising a semiconductor substrate and a patterned metal layer thereon, wherein the semiconductor substrate and the patterned metal layer thereon comprise the steps of:

(a) forming a semiconductor oxide on said semiconductor substrate;

(b) forming a plurality of different metal layers in said patterned metal layer, wherein the first metal layer is in contact with the semiconductor oxide of the substrate, the final metal layer is in contact with an etching reactant, wherein said first metal layer comprises metals that form stable metal-semiconductor alloy, wherein said metal-semiconductor alloy comprises a compound being selected from the group consisting of silicides and germanides of one or more metals selected from a group containing Pt, Pd, Cu, Ni and Rh;

(c) heating said substrate and the metal layer thereon in order to realize at the same time the formation of the metal-semiconductor alloy and a metal dewetting, wherein the metal dewetting comprises the formation of an interconnected metal pattern having features, wherein the features of said interconnected metal pattern comprises holes in the metal layer wherein the feature size of the said holes is at least 1 nm.

Therefore, the present disclosures provide methods to fabricate high aspect ratio patterns in a semiconductor substrate that are elements of photonic devices, such as diffractive gratings by using a continuous metal mesh with a stabilizing catalyst that involves the formation of a stable metal-semiconductor alloy and etching in presence of air in a continuous flow and an etchant. The presence of the stabilizing catalyst allows to etch the substrate in vertical direction even in conditions of very low oxidant concentration (e.g. the oxidizer species being present in the air) without any external bias or magnetic field so to realize very high aspect ratio structures in the semiconductor substrate.

Photonic devices are components for creating, manipulating or detecting light. This can include laser diodes, light-emitting diodes, solar and photovoltaic cells, displays and optical amplifiers, diffractive patterns, periodic refractive and diffractive structures, gratings and lenses.

In a preferred embodiment of the present invention, the patterned metal layer may comprise a bottom layer of a metal-semiconductor alloy, wherein the said metal-semiconductor alloy comprises a compound being selected from the group consisting of silicides and germanides with: Pt, Pd, Cu, Ni, Rh.

Preferably, the oxidant gas can comprise air.

In a preferred embodiment of the present invention the etchant may comprise HF in vapor phase as evaporated from a liquid solution containing water diluted HF.

In a preferred embodiment of the present invention the etchant may comprise a solution of water diluted HF in liquid phase.

In a preferred embodiment of the present invention the semiconductor substrate may contain a semiconductor selected from the group consisting of: Si, Ge, or a III-V semiconductor and wherein the metal may contain a metal selected from the group consisting of: Au, Ag, Pt, Pd, Cu, Ni, Rh as a top layer catalyst.

In a preferred embodiment of the present invention the semiconductor substrate and the metal patterned layer thereon may be heated to a temperature in the range from 30° C. to 90° C. during the exposing to the oxidant gas and the etchant.

In a preferred embodiment of the present invention the oxidant gas may be produced by decomposing $H_2O_2$ on a platinum surface being a solid piece containing platinum immersed in a liquid solution containing water diluted $H_2O_2$.

In a preferred embodiment of the present invention, the method may be carried out in presence of an inert gas selected from the group consisting of: nitrogen, argon and helium.

In a preferred embodiment of the present invention, the method may be carried out in the presence of an alcohol selected from the group consisting of: isopropanol, methanol, ethanol.

In a preferred embodiment of the present invention the oxidant gas and the etchant gas can be connected to an enclosed etching chamber in separated gas lines.

In a preferred embodiment of the present invention the patterned metal layer may comprise a continuous mesh pattern, and wherein the etched semiconductor structure may comprise an array of nanowires with aspect ratio of at least 10:1.

In a preferred embodiment of the present invention the patterned metal layer may comprise an X-ray diffractive grating pattern with periodic features, and wherein the etched semiconductor structure may comprise an X-ray diffractive grating with periodic features.

BRIEF DESCRIPTION OF THE FIGURES

Preferred embodiments of the present invention are hereinafter described in more detail with reference to the attached drawings which depict the following:

FIG. 12 SEM images showing the details of the etched silicon by MacEtch with air as oxidant (A, B) and with HF and H2O2 in liquid phase (C, D). The typical mesoporous structure of the liquid phase MacEtch of low resistivity silicon is highlighted by the characteristic inverted V shape (C, D).

DETAILED DESCRIPTION OF THE INVENTION

Figure 1:
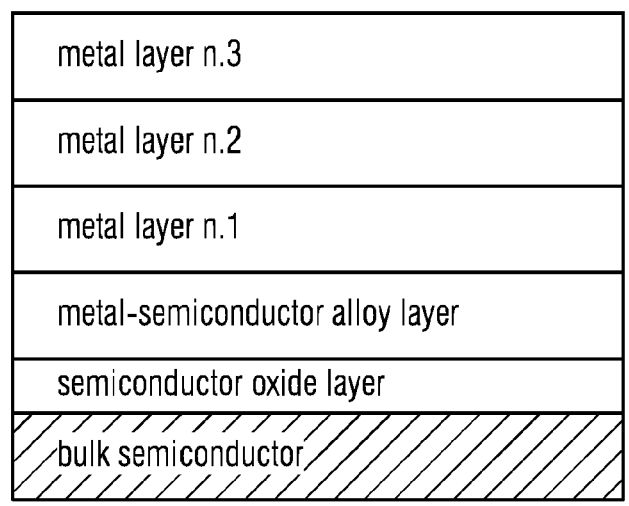
FIG. 1 is schematically showing a semiconductor substrate covered by a multilayer metal catalyst. The semiconductor substrate can have a thin oxide layer. The metal n.1 forms a stable metal-semiconductor alloy with the semiconductor substrate. The metal stuck can be composed of several metal layers.

Photonic devices are components for creating, manipulating or detecting light. This can include laser diodes, light-emitting diodes, solar and photovoltaic cells, displays and optical amplifiers, diffractive patterns, periodic refractive and diffractive structures, gratings and lenses. The present disclosure provides a method to fabricate high aspect ratio patterns in a semiconductor substrate that are elements of photonic devices, such as diffractive gratings by using a continuous metal mesh with a stabilizing catalyst that involves the formation of a stable metal-semiconductor alloy and etching in presence of air in a continuous flow and an etchant. The presence of the stabilizing catalyst allows to etch the substrate in vertical direction even in conditions of very low oxidant concentration (e.g. the oxidizer species being present in the air) without any external bias or magnetic field so to realize very high aspect ratio structures in the semiconductor substrate. The metal layer on the semiconductor substrate reacts with the oxygen contained in the air and catalyzes the semiconductor etching by the etchant. Air in continuous flow in proximity of the metal layer allows to maintain constant the oxidant concentration in proximity of the metal layer. The etchant can be a water diluted HF solution or it can be provided by the evaporation of hydrofluoric acid from a solution containing water diluted HF. The continuous air flow supports the diffusion of the reactant species (e.g. oxygen and the etchant) through the etched semiconductor so to maintain a uniform etching rate of the high aspect ratio structure. The continuous air flow supports the diffusion of the reaction by-products so to avoid the poisoning of the etching reaction. Since the oxidant gas is provided by the normal air, the system has particular advantage for implementation as it does not require any handling of hazardous and inflammable gases such as $O_2$ gas or instable chemical such as $H_2O_2$.

The method comprises the provision of a semiconductor substrate and a metal pattern thereon. In certain embodiments, the semiconductor substrate can include an oxygen terminated layer or a thin semiconductor oxide layer at the interface between the semiconductor bulk material and the metal layer. In certain embodiments, the metal pattern can be composed of a plurality of different metal layers. An example of the above described multilayer structure is reported in FIG. 1.

The first metal layer is on contact with the oxygen terminated surface of the substrate, the final metal layer is in contact with the etching reactants. The metals of the first layer is chosen in the list of metals that form stable metal-semiconductor alloy with the substrate. The metals of the final layer is chosen in the list of MacEtch catalysts: Ag, Au, Pt, Pd, Cu, Ni, Rh. In certain embodiments a single metal layer is chosen, the metal is chosen in the list of: Pt, Pd, Cu, Ni, Rh. The metal of above list can act as catalyst for MacEtch and form stable metal-semiconductor alloy with Si and Ge as substrate, which are called silicide and germanide, respectively. Some examples of stable silicides that can be formed by thin film reaction are: PtSi, $Pt_2Si$, PdSi, $Pd_2Si$, $Pd_3Si$, $Pd_4Si$, $Pd_5Si$, $Cu_3Si$, NiSi, $Ni_2Si$, $Ni_3Si$, $Ni_5Si_2$, $Ni_3Si_2$, $Rh_3Si$. Some examples of stable germanides that can be formed by thin film reaction are: PtGe, $PtGe_2$, PdGe, $Pd_2Ge$, $Cu_3Ge$, $Cu_5Ge_2$, NiGe, $Ni_5Ge$, RhGe, $Rh_2Ge$, $Rh_3Ge$, $Rh_5Ge_3$, $Rh_3Ge_4$.

An example of the metal layer structure is reported in FIG. 1. The formation of stable metal-semiconductor alloys with Si or Ge can be detected by XPS, TEM or RBS analyses.

In certain embodiments, the semiconductor substrate with the metal pattern thereon is heated. During the heating, the semiconductor substrate with the metal pattern thereon is exposed to an oxidant gas containing $O_2$ (e.g. air) in a continuous flow and an acid gas containing HF such as the vapor produced by the evaporation of a liquid solution containing water diluted HF. The reactant gas species (gas containing $O_2$ and HF) diffuse through the patterned metal layer and the metal covered regions of the semiconductor substrate are etched, thereby forming an etched semiconductor structure. Once the etched semiconductor structure is formed, the continuous gas flow supports the gas species diffusing through the etched semiconductor structure. This promotes the mass transport of the reactant species and the etching byproducts, thereby the process can continue for long time in order to form very high aspect ratio structures.

The presence of the stabilizing catalyst that involves the formation of a stable metal-semiconductor alloy allows to realize a uniform etching of the substrate in vertical direction even in conditions of very low oxidant concentration and very dense patterns such as the X-ray diffraction gratings.

The present method allows to reach very high etching rate in the range of 20-24 μm/hr that are comparable to values of the liquid phase MacEtch. In reference to a previous report by Hu et al. where a maximum depth of 6 μm is reached thanks to a series of 6 wet/dry cycles with an etching rate of 2 μm/hour, with certain embodiments of this disclosure the etching rate is improved at least by a factor 10. With respect to a previous report by Hu et al. where the nanowires length was limited to a maximum of 6 μm due to the limited diffusion of oxygen through the liquid etchant layer, the present method allows to etch nanowires with at least 17 times longer length.

The method of present disclosure uses a very low oxidant concentration, this limits the excess of charge carriers injected in the semiconductor from the metal catalyst that is the main cause of undesired porosity of the etched structures. Therefore, the method of present disclosure produces almost negligible porosity without any external bias. Moreover, the process is very stable without any external bias or magnetic field for any pattern size and features. With respect to a previous report by Hildreth et al., the presence of the stabilizing catalyst that involves the formation of a stable metal-semiconductor alloy and the continuous mesh pattern allow to realize uniform etching of the substrate with uniform depth and shape of the etched structure in the vertical direction.

Being a MacEtch reaction, the method is a promising low cost technology for producing high aspect ratio nanostructures on large area by surpassing the limits of other gas phase etching techniques at the nanoscale, such as reactive ion etching. Being a gas-solid reaction, it can be used for stiction sensitive applications without requiring additional post etching drying processes. With respect to previous disclosures, the method has the innovation to use normal air as oxidant gas instead of $H_2O_2$ vapor that comes from evaporation of a liquid solution containing water diluted HF and $H_2O_2$. Since $H_2O_2$ is the less volatile species in the liquid solution, it is necessary to significantly increase the volume of $H_2O_2$ (e.g. 30%) in the solution with respect of MacEtch in liquid phase (e.g. 1%). The volume of $H_2O_2$ in the liquid solution limits the quantity of HF concentration in the etchant vapor. Thus, the presence of $H_2O_2$ in the liquid solution substantially reduces the concentration of HF in the vapor phase. The method of the present disclosure maximizes the concentration of HF in the etchant gas with the advantage of extremely high precision of pattern transfer and very high etching rate in the range of 20 μm/hr. The method has the advantage to be performed with materials that are sensitive to the exposure with 30% $H_2O_2$, for example: cupper, brass, carbon steel, cast iron, tungsten carbide, styrene butadiene rubber, polysulfide polymers, thermoplastic elastomers, thermoplastic polyurethanes, nitrile, neoprene, polyester elastomer, and polyamides.

Moreover, the method has the advantage to avoid the handling of heavily concentrated $H_2O_2$, while normal air is present everywhere and free of charge. Moreover, the presence of a continuous flow of air helps to diffuse the reactive species through the etched substrate once a very high aspect ratio structure is formed. The continuous flow of air through the etched substrate promotes the supply of reactive species to the metal catalyst allowing to continue the etching for several hours. The continuous flow of air along the surface of the etched substrate promotes the release and the dispersion of reaction byproduct such as water that is detrimental for stiction sensitive nanostructures. In certain embodiments of the present disclosure the etching is a "dry" process, it can be used for stiction sensitive applications without requiring additional post etching drying processes.

Figure 2:
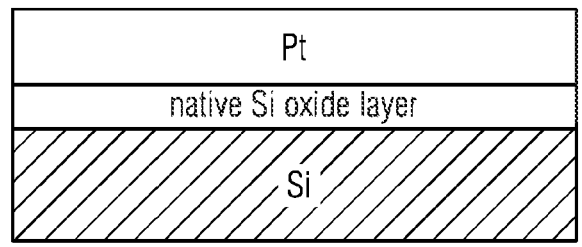
FIG. 2 is schematically showing a Si semiconductor substrate covered by a Pt metal catalyst layer (A) that undergoes a metal de-wetting to form a mesh pattern and Pt silicide formation to stabilize the catalyst (B); the etching mechanism in presence of air and HF as etchant in gas phase (C); the formation of an etched structure in the Si substrate (D).
Figure 2:
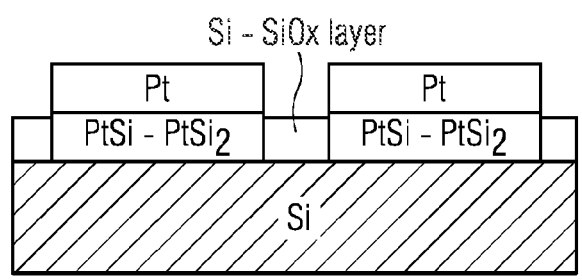
Figure 2:
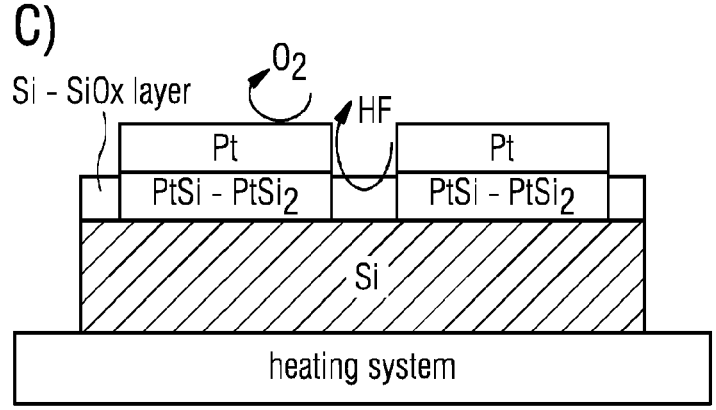
Figure 2:
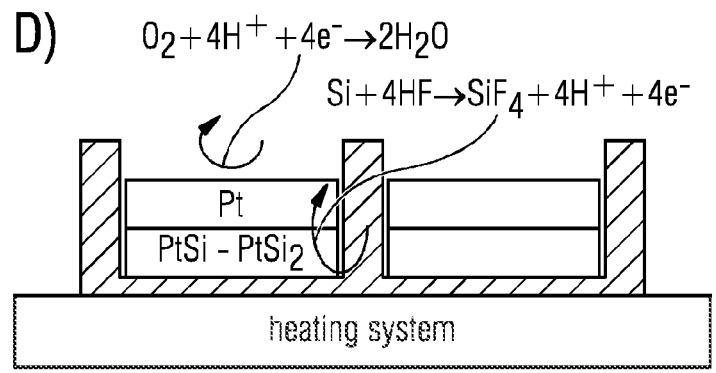

Described in reference to FIG. 2 is a method to fabricate high aspect ratio patterns in semiconductor substrates, such as diffractive gratings and other diffractive periodic structures in a semiconductor substrate by using the metal assisted chemical etching with a continuous flow of air and hydrofluoric acid. Then, FIGS. 3, 4 and 5 describe some examples to realize a system for fabricating photonic devices elements with the method of the present disclosure.

Referring first to the flow chart of FIG. 2, the method entails the metal layer deposition (FIG. 2A) on a semiconductor substrate. The metal may comprise platinum (but is not limited to platinum). The semiconductor substrate may comprise silicon (but is not limited to silicon). The semiconductor substrate may comprise an oxide layer (e.g. native Si oxide layer, but is not limited to native silicon oxide). The method entails the formation of a continuous mesh pattern of the metal layer (FIG. 2B). In certain embodiments platinum is used as a metal layer and silicon with native silicon oxide is used as semiconductor substrate, a continuous mesh pattern of the metal layer is formed by thin film de-wetting, the de-wetting temperature is about 250° C. for Pt film thickness of 10 nm.

The method entails the formation of a stable metal-semiconductor alloy that acts as a stabilizing layer for the metal catalyst between the metal layer and the semiconductor substrate. In certain embodiments, platinum is used as a metal layer and silicon with native silicon oxide is used as semiconductor substrate, the stable metal-semiconductor alloy (e.g. Pt silicide, PtSi, $Pt_2Si$) is formed by annealing at the temperature in the range of 250 to 600° C. The Pt silicide ensures a robust adhesion of the metal to the Si substrate during MacEtch in conditions of high HF concentration. The method entails an oxidant and an etchant. In certain embodiments the oxidant is air and the etchant is HF. In certain embodiments the oxidant is air and the etchant is HF evaporated from a water diluted HF solution.

The method entails the semiconductor substrate and the patterned metal layer thereon are exposed to air and etchant during the heating, and air and etchant diffuse on the patterned metal layer (FIG. 2C). In one example, silicon with a native silicon oxide is used as semiconductor substrate, the residual silicon oxide layer is etched away during the exposure to HF (FIG. 2C). The metal layer acts as catalyst. The oxidant present in the air selectively oxidizes region of the semiconductor substrate underneath the patterned metal layer and the etchant selectively removes the oxidized regions (FIG. 2D). Accordingly, the metal covered regions of the semiconductor substrate are etched, inducing the patterned metal layer to sink into the semiconductor substrate (FIG. 2D).

Thus, an etched semiconductor structure is formed. The etching mechanism is reported in FIG. 2D and described in detail below. The $O_2$ species present in the air diffuses on the patterned metal layer, the metal acts as catalyst for the following cathode reaction:

$$O_2 + 4H^+ + 4e^- \rightarrow 2H_2O \tag{1}$$

As a consequence, hole charge carriers are injected deep into the valence band of the semiconductor. The concentration of holes becomes higher in the region surrounding the metal catalyst. Directly beneath the metal layer, the current density of holes reaches its maximum and becomes high enough for dissolving Si there (anode reaction). According to the literature Si can be dissolved with two different reactions, the direct dissolution (Eq. 2):

$$Si + 4h^+ + 4HF \rightarrow SiF_4 + 4H^+ \tag{2}$$

or via oxidation of Si (Eq. 3), $$Si + 2H_2O + 4h^+ \rightarrow SiO_2 + 4H^+ \tag{3}$$

followed by the dissolution of the oxide (Eq. 4):

$$SiO_2 + 2HF_2^- + 2HF \rightarrow SiF_6^{2-} + 2H_2O \tag{4}$$

The reaction continues as the catalyst is pulled down into the substrate. The etching in the gas-phase reaction takes place via a slow gas-solid reaction. $H_2O$ is formed as by-product of cathodic reaction (Eq. 1) and can eventually catalyze the anodic reaction of Si oxidation (Eq.3).

Figure 3:
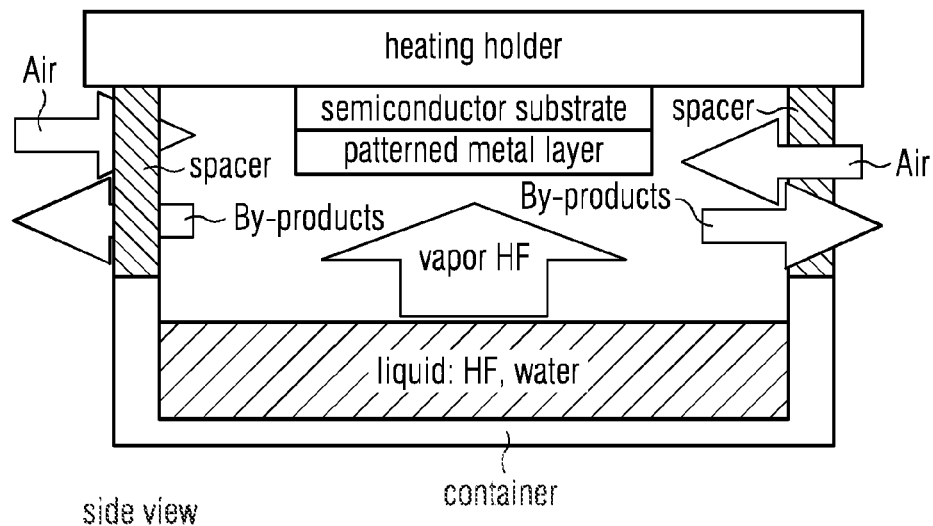
FIG. 3 is schematically showing an example of apparatus to fabricate high aspect ratio photonic devices elements with air as oxidant, vapor HF as etchant and an open chamber in side view (A) and top view (B). The drawing is not to scale.
Figure 3:
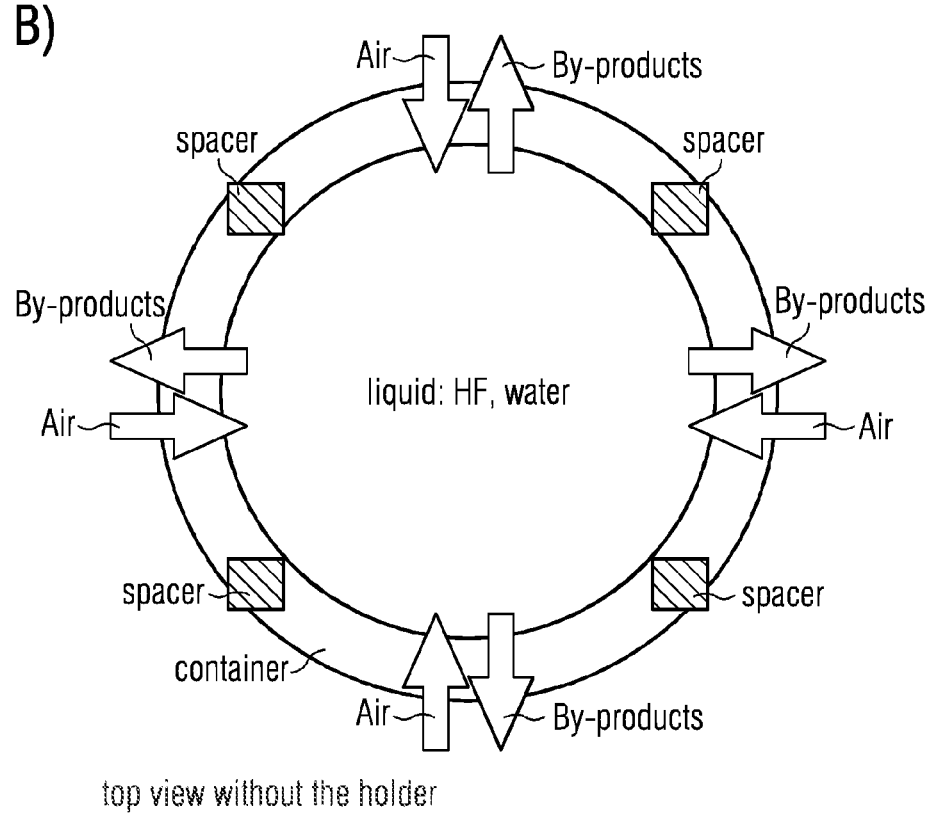

FIG. 3 shows an example of system to fabricate photonic devices elements, such as diffractive gratings. The system comprises:
1) flowing air as oxidant gas;
2) evaporating HF from a liquid solution containing water diluted HF;
3) the semiconductor substrate with the metal pattern thereon is placed on a heating holder;
4) the semiconductor substrate with the metal pattern thereon stands close to the liquid solution, that is within a few centimeters;
5) the semiconductor substrate with the metal pattern thereon is heated and the etching occurs via a gas-solid reaction being no liquid condensation formed on the sample;
6) the holder is supported on 4 spacers on the container of the liquid HF solution in order to form a reaction chamber that opens pass for the air to flow in;
7) the system is placed on a bench under laminar flow of air.

In this example, the sample including a patterned catalyst layer on a semiconductor substrate is supported on a hot plate or other heating system and held within a few centimeters above the liquid solution containing water diluted HF. The system has been realized by modifying a simple commercial vapor HF tool, the liquid solution was held at room temperature and the samples were held approximately 2 cm above the liquid solution by using an HF-compatible chuck with a resistive heating system and a substrate temperature control.

The sample holder lays on a set of four spacers made of teflon that are placed on the border of the container of the liquid solution. This makes the etching chamber open and the air can easily flow in. The system is placed on a bench in an aerated environment under laminar flow that provides clean air. The innovative implementation of the conventional vapor HF tool consists in the realization of the open etching chamber by mean of a set of four spacers between the holder and the liquid solution container. The air flow is implemented by placing the system in air under laminar flow, while the conventional vapor HF tool is usually located in a fume hood with air aspiration.

In the etching system with the open chamber the air can flow in and diffuses on the patterned metal layer and through the etched structure. In reference to a previous report by Hu et al. where air is only used to dry and a long series of cycling of wet/dry was used to realize the MacEtch of silicon substrate, the innovation of this method consists into exposing the sample to air during the whole etching process with the advantage of a continuous etching process. Moreover, in this method the sample is heated during the MacEcth in order the MacEtch reaction takes place via a slow gas/solid reaction instead of liquid/solid such as in the previous report by Hu et al. Once the etched structure in the semiconductor substrate is formed, the presence of air flow on the etched structure helps also to diffuse the reactant species inside the etched structures and to remove the reaction by-products.

The presence of air flow is relevant to etch very deep semiconductor structures (e.g. trenches deeper than 10 μm) with very high aspect ratio (e.g. aspect ratio higher than 10:1). The sample holder has an HF-compatible chuck with substrate temperature control and the sample is heated to a temperature in the range from 35° C. to 60° C. The heating temperature has a relevant role to avoid water condensation and nanostructures stiction. Moreover, the etching rate of wet MacEtch is reported to increase with temperature, therefore the efficiency of the disclosed method is expected to increase with increasing the reaction temperature.

Figure 4:
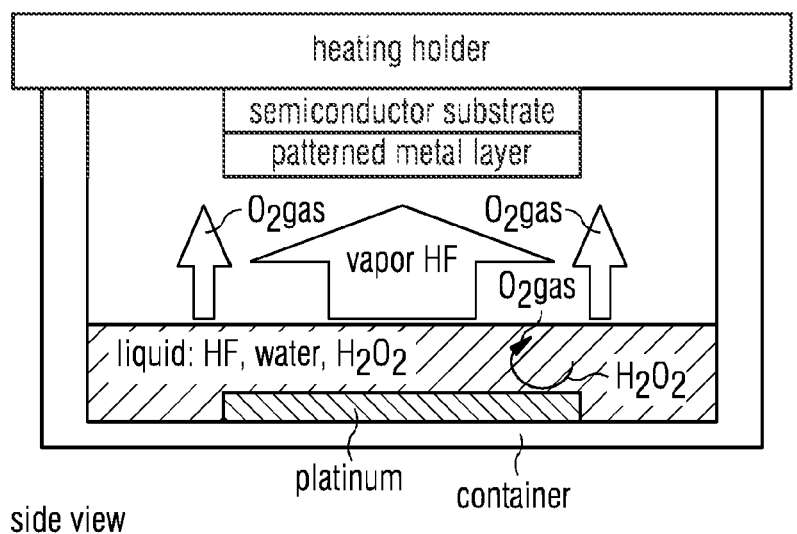
FIG. 4 is schematically showing an example of apparatus to fabricate high aspect ratio photonic devices elements with vapor HF and $O_2$ gas supplied by a reaction of $H_2O_2$ with a solid Pt piece in the liquid solution containing HF, water and $H_2O_2$, in side view (A) and top view (B). The drawing is not to scale.
Figure 4:
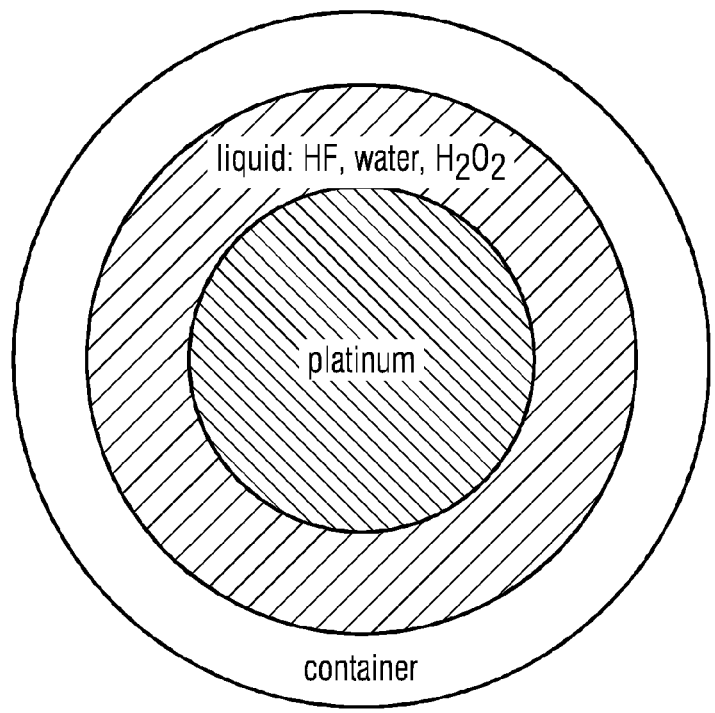

FIG. 4 shows another example of system to fabricate photonic devices elements, such as diffractive gratings with the method of the present disclosure. In reference to FIG. 4, $O_2$ gas is produced in the liquid solution containing water diluted HF and water diluted $H_2O_2$ and a solid platinum piece. The liquid $H_2O_2$ is decomposed on the surface of the solid platinum piece immersed in the liquid solution with the generation of $O_2$ gas as by-product. The $O_2$ gas forms bubbles in the liquid that are then exploding and releasing $O_2$ gas. The $O_2$ gas can diffuse and reach the catalyst layer on top of the sample to be etched.

The $O_2$ gas obtained from the decomposition of $H_2O_2$ on the platinum surface increases the $O_2$ concentration in the air to support the MacEtch. The amount of $O_2$ gas released by the liquid solution can be varied by selecting a specific volume of water diluted $H_2O_2$ to be present in the liquid solution containing the water diluted HF and the water diluted $H_2O_2$. The amount of $O_2$ gas released by the liquid solution can be varied by selecting a specific area of the solid platinum piece to be immersed in the liquid solution containing the water diluted HF and the water diluted $H_2O_2$. The uniformity of the $O_2$ gas released by the liquid solution can be varied by selecting a specific shape (e.g. a platinum wire mesh) of the solid platinum piece to be immersed in the liquid solution containing the water diluted HF and the water diluted $H_2O_2$. This embodiment of the method allows to supply the concentration of $O_2$ gas in the air by keeping the etching chamber closed. With respect to a previous report by Hildreth et al., the method of the present disclosure allows to obtain higher etching rate since the concentration of oxidant is increased with respect to the concentration of evaporated $H_2O_2$.

Figure 5:
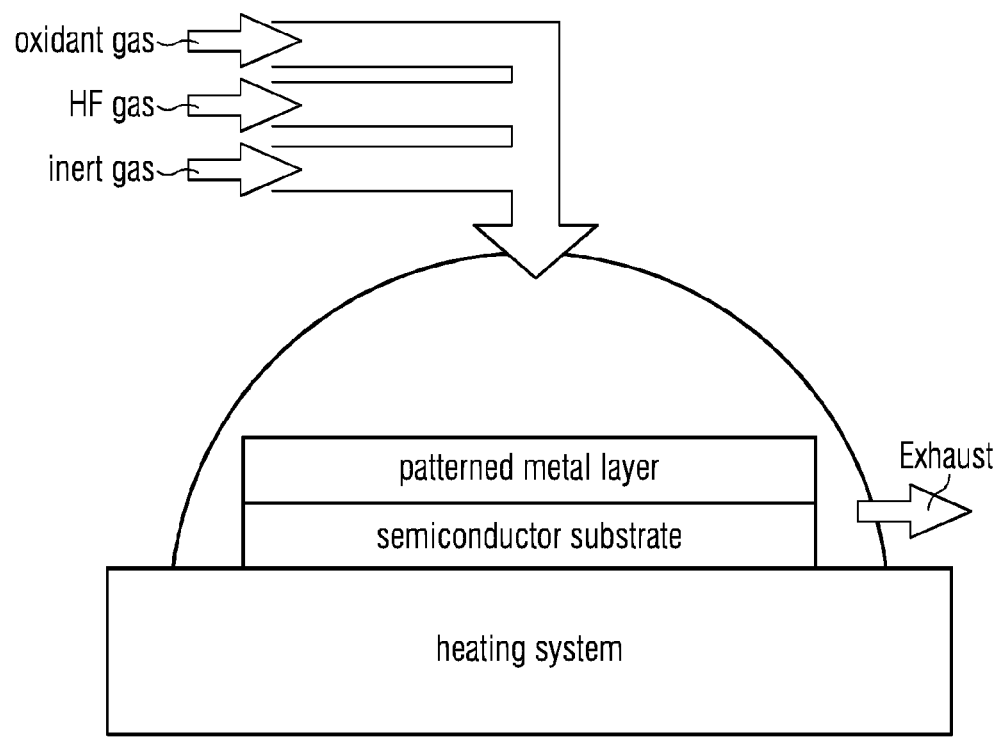
FIG. 5 is schematically showing an example of apparatus to fabricate high aspect ratio photonic devices elements with an enclosed etching chamber connected at least to an oxidant gas line and an etchant gas line and eventually connected to an inert gas line. The drawing is not to scale.

FIG. 5 shows another example of system to fabricate photonic devices elements with the method of the present disclosure. The example contains at least two separated and independent gas lines, at least one gas line for an oxidant gas and at least one gas line for an etchant gas, being each gas line in fluid connection to an etching chamber. An additional gas line can provide a non-reactive gas as purging (e.g. nitrogen or argon). The semiconductor substrate and the metal pattern with the stable metal-semiconductor alloy thereon are placed on a sample holder, the holder lays in an enclosed etching chamber, the etching chamber can be eventually evacuated. The sample holder can eventually provide the sample heating. The gas flow in each gas line in fluid connection to the etching chamber can be independently regulated. The sample can be exposed to the oxidant and the etchant gases by flowing both gases at the same time or by flowing one gas per time with an eventual step of purging gas and an eventual step of chamber evacuation. The oxidant and the etchant gas can flow and diffuse on the metal pattern and thereby forming an etched semiconductor structure. The sample can eventually be heated during the exposing of the oxidant and etchant gases.

The proposed etching tool differs from the one by Hu et al. since the present method does not flow oxygen gas through a liquid HF solution. The innovation here disclosed is characterized by the presence of separated gas lines for oxidant and etchant. In particular, in the present invention, the etchant gas can be anhydrous HF and the semiconductor substrate with metal pattern thereon is heated during the exposure to the etchant atmosphere in order to minimize the presence of water, being water condensation detrimental for producing high aspect ratio nanostructures.

Using a catalyst that has high efficiency reaction with oxidizers, such as platinum, the method of the present disclosure can etch the semiconductor substrate for several hours in a gas atmosphere that contains a very small amount of oxidant and a high concentration of etchant, producing very deep trench (e.g. 100 µm), huge aspect ratio structures (in the range of 1000-10000 to 1) and very sharp features at the scale of 1 to 100 nm. In certain embodiments, a self-assembled platinum metal pattern on top of a silicon substrate is used to produce a carpet of high aspect ratio silicon nanowires. In certain embodiments, a thermal treatment is used to induce the platinum film de-wetting with the consequent formation of a nanostructured metal pattern. De-wetting occurred for Pt deposition on oxygen terminated Si surface, whilst no de-wetting was observed under the same experimental conditions when the native oxide was removed by dipping the substrate in HF immediately before the Pt deposition.

Figure 6:
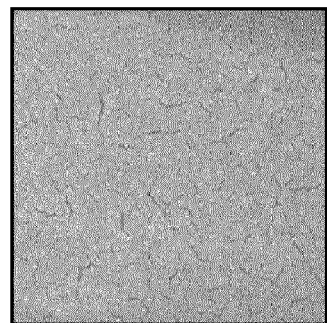
FIG. 6 shows plan scanning electron microscope (SEM) images of Pt (bright contrast areas) film on Si (dark contrast areas) substrate undergoing a metal de-wetting by a thermal treatment at different temperatures.
Figure 6:
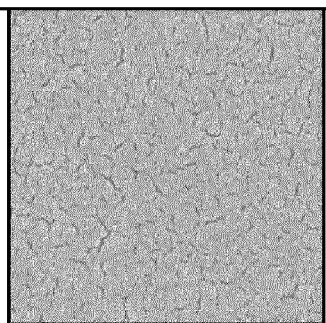
Figure 6:
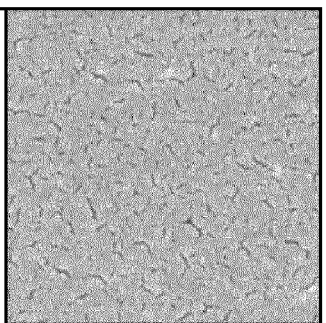
Figure 6:
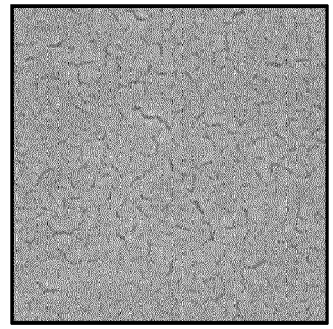
Figure 6:
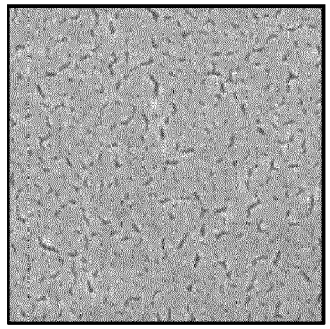
Figure 6:
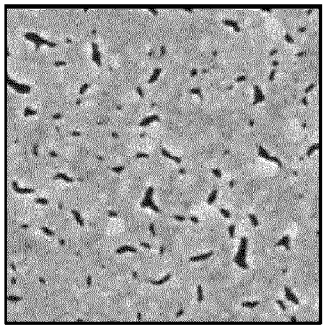
Figure 6:
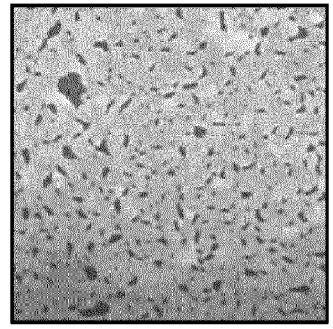
Figure 6:
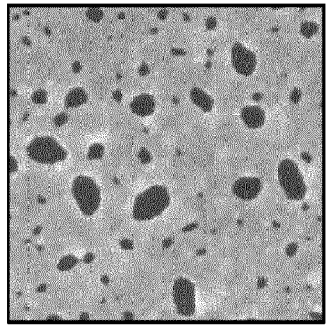
Figure 6:
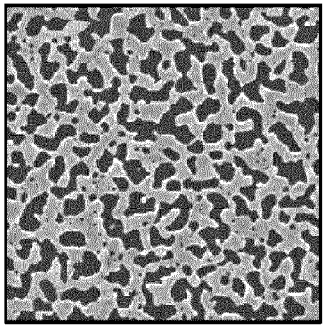

Described in reference to FIGS. 6 is an example of tuning the size distribution of holes produced by de-wetting of thin Pt film on Si substrate with native silicon oxide layer. In this example, the Si substrate with native silicon oxide was cleaned by oxygen plasma, then a Pt film was deposited by electron beam evaporation with a deposition rate of 0.5 nm/min and Pt film thickness in the range of 5 to 20 nm. The substrate with the metal film thereon was annealed in air at temperature in the range of 250° C. to 600° C. to produce the metal film de-wetting. FIGS. 6A-I shows the SEM images of Pt film morphology at different de-wetting temperature. Referring to FIGS. 6A-I, the metal has bright contrast while the holes show the silicon substrate in a darker grey. Thus, the metal layer is patterned in a self-assembly nanostructure, the metal holes have size distribution in the range of few nanometers to hundredth nanometers.

Thus, the perforated Pt film of FIGS. 6A-I are examples of self-assembled metal mask for the realization of nanowires by MacEtch. The de-wetting occurs with a progressive increase of film fractures density (250-350° C.) and finally the hole formation appeared (400-500° C.), followed by a coalescence process of holes expansion (550-600° C.). Once the film thickness and deposition conditions are fixed, the de-wetting temperature can be used as a tuning parameter for the features size of the Pt pattern, the average hole size increases from few (<400° C.) to tens (450-550° C.) and hundreds (>550° C.) of nanometers. Pt silicide formation has been extensively reported in literature for the annealing temperature in the range of 400-600° C.

A silicon oxide layer at the metal-substrate interface is usually a barrier layer for metal silicide formation, but Pt silicide has been reported to form also in presence of a native oxide layer. The formation of a top layer of $SiO_2$ is possible in case of annealing in oxidizing ambient. The growth of asymmetric holes during de-wetting is observed in all FIGS. 6 and it is an indication of silicide formation.

Figure 7:
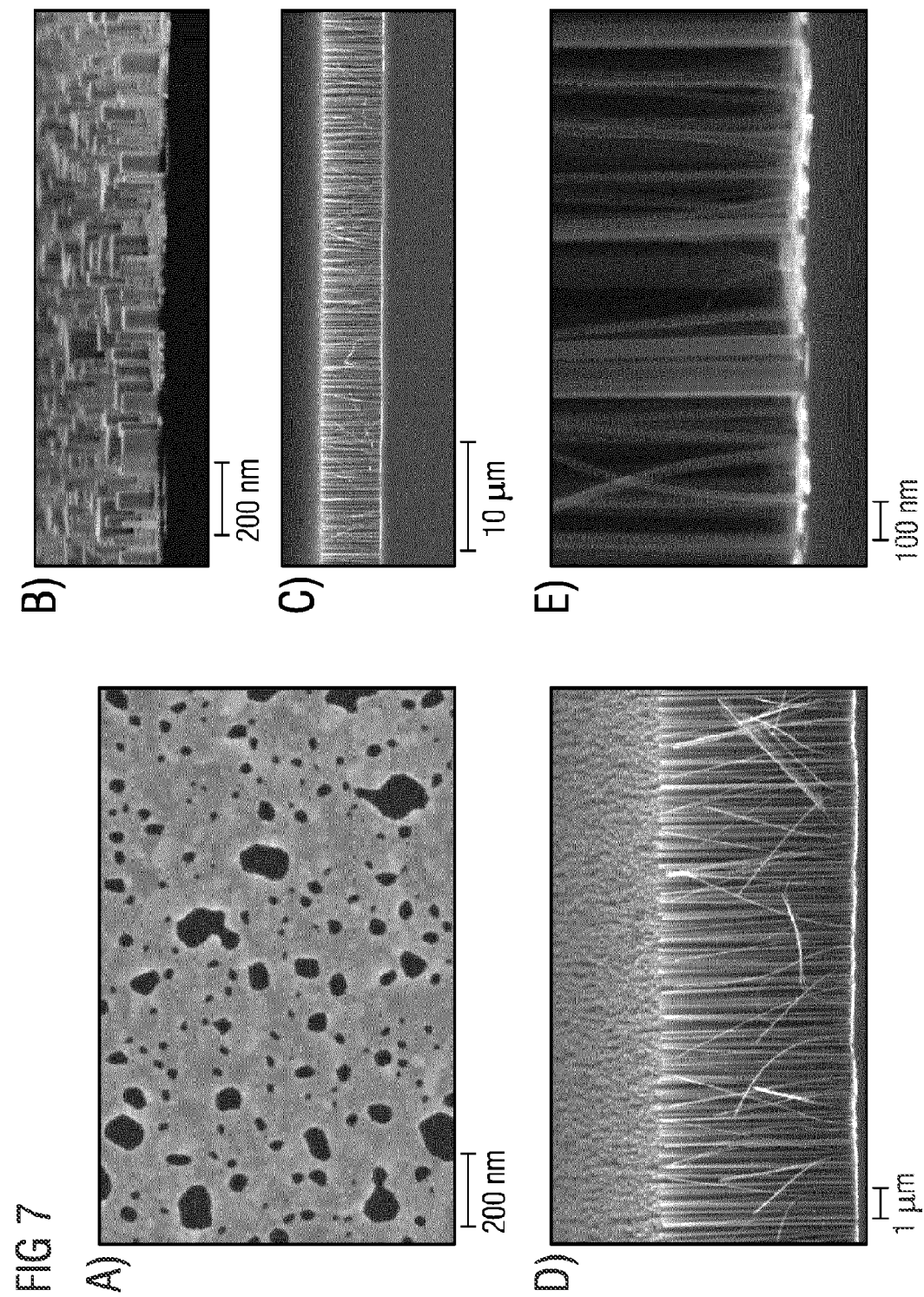
FIG. 7 shows plan view SEM of continuous mesh patterned Pt layer on Si (A) and cross section view SEM of etched sample after exposure to air and HF produced by evaporation of a liquid solution containing water diluted HF for 10 min (B) and 1 hour (C). High magnification SEM in cross section of the formed nanowires carpet (D) and bottom of the nanowires (E).

Described with reference to FIG. 7 is the realization of nanowires by the method of the present disclosure with Pt self-assembled metal mask by de-wetting. Nanowires can be used as diffractive optics in speckle based X-ray phase contrast imaging. Nanowires are expected to improve the sensitivity of speckle-based X-ray imaging by producing speckles of smaller size and much better uniformity in comparison to sandpaper or other membranes with feature size in the micron range.

A thin Pt film was deposited on Si substrate with native silicon oxide layer, the substrate with the metal film thereon was annealed in air at 550° C. to produce the metal film de-wetting. A scanning electron microscope (SEM) micrograph in plan view is reported in FIG. 7A. The substrate with the metal pattern thereon is heated at 55° C. for 10 min and then exposed to a gas phase etchant. The gas phase etchant is produced by using the system of FIG. 3. The oxidant is provided by flowing air. The etchant is evaporated from a liquid solution containing water diluted HF, the HF concentration in the liquid is in the range of 1 to 20 mol/l. The substrate with the metal pattern is held at 2 cm from the liquid surface. The gas phase etchant diffuses through the metal pattern, the silicon substrate behind the metal is etched and the metal pattern sinks into the substrate. Thus, a silicon etched structure is formed. After 10 min of etchant exposure the substrate is clearly etched and the silicon etched structure appear like pillars, as shown in the SEM micrograph in cross section of FIG. 7B.

The metal mask of FIG. 7A and the silicon pillars of FIG. 7B show a good matching of the structural features, indicating that the method has excellent capability of pattern transfer at the nanometer scale.

FIG. 7C shows the silicon structure after one hour exposure to the etchant, the silicon pillars are now 6 µm long and can be called nanowires. A uniform carpet of silicon nanowires (FIG. 7C) is formed by the disclosed method of the present invention. FIG. 7D shows a magnified image of the silicon nanowires, the top nanowires are well separated with reduced agglomeration with respect of nanowires produced by wet etching methods. FIG. 7E shows a magnified image of the bottom of the silicon nanowires, the nanowires section is measured by SEM and is in the range of 10 to 100 nm. The aspect ratio of the nanowires is calculated by the ratio of the average section diameter (e.g. 10 to 100 nm) and the nanowires length (e.g. 6 μm). Thus, the aspect ratio is in the range of 60 to 600 to 1.

Figure 8:
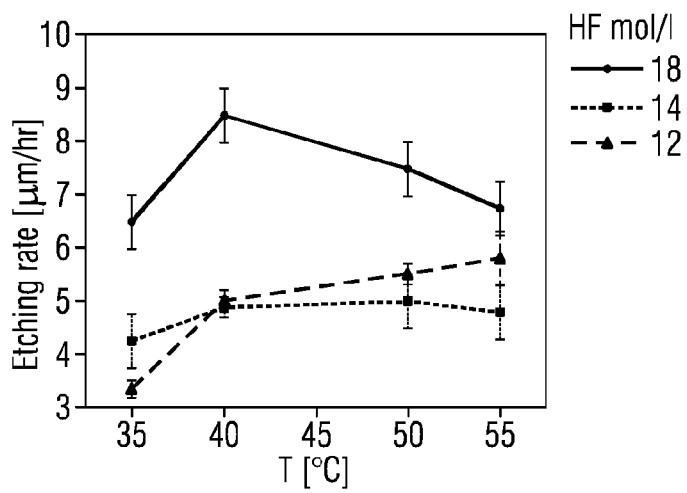
FIG. 8 shows the etching rate as a function of substrate temperature (A) and HF concentration in the liquid solution (B), the etchant evaporates from the liquid solution and the oxidant is air. A cross section SEM (C) of etched nanowires with length of 107 μm in 4 hours.
Figure 8:
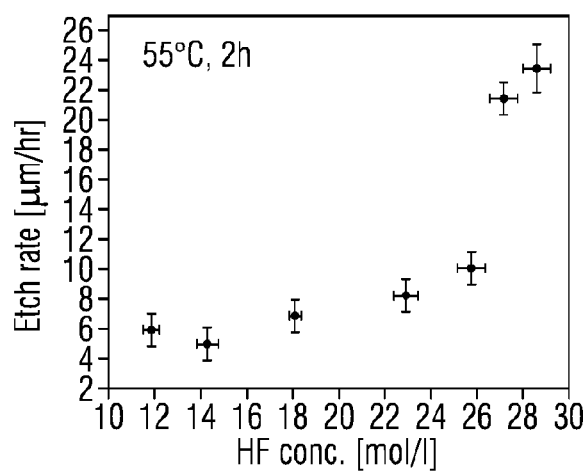
Figure 8:
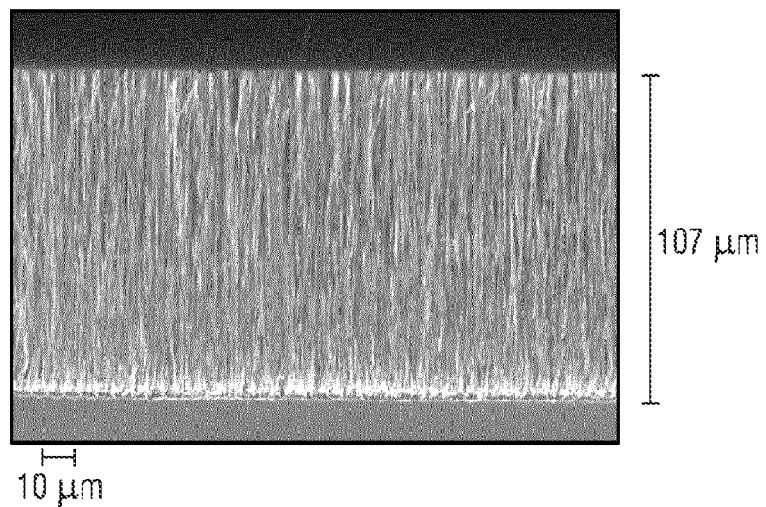

FIG. 8A reports the etching rate for the system showed in FIG. 3 as a function of the heating temperature of the silicon substrate and the metal pattern thereon and the molar concentration of HF in the liquid solution containing water diluted HF. The etching rate has been calculated by measuring the length of nanowires produced in 2 hours in the experimental set up of FIG. 3. The samples are square of 1×1 cm$^2$ cleaved from a silicon substrate with platinum self-assembled mask by de-wetting, the silicon substrate is N type <100> single crystal with resistivity in the range of 0.001 to 0.01 Ωcm. The liquid solution has been obtained by adding deionized water to a commercial water diluted HF solution at 50%. By increasing the temperature in the range of 35 to 40° C., the etching rate increases in agreement with previous studies on MacEtch kinetics in liquid. For high HF concentration (18 mol/l), the etching rate has a clear maximum at 40° C., then it decreases as a function of temperature, indicating that the reaction rate is limited by the HF desorption. For the low HF concentration (12 mol/l), the etching rate slightly increases with the temperature but the variation of etching rate is quite small (15%) in the full range of temperature (35 to 55° C.). Indeed, this represents a remarkable stable processing window, where the degradation of HF concentration with time can have a negligible effect on the etching rate.

FIG. 8B shows the etching rate for the system showed in FIG. 3 at 55° C. as a function of the molar concentration of HF in the liquid solution containing water diluted HF. The liquid solution is obtained by adding deionized water to a commercial water diluted HF solution at 50%. Very high etching rate of 20 to 24 μm/h are reported for very high HF concentration, these values are comparable to MacEtch in liquid phase. In reference to a previous report by Hu et al. where a maximum depth of 6 μm is reached thanks to a series of six wet/dry cycles with an etching rate of 2 μm/hour, with the method of the present disclosure the etching rate is improved at least by one order of magnitude.

FIG. 8C shows the SEM in cross section of silicon nanowires with a length of at least 107 μm obtained by heating the silicon with platinum mask thereon at 55° C. during the exposition to air and HF evaporated from a liquid solution with molar concentration of HF in the range of 20 to 29 mol/l for 4 hours. Being the nanowires section in the range 10 to 100 nm, the aspect ratio of the nanostructures in FIG. 8B is in the range of 1000 to 10000 to 1. The nanowires have low agglomeration, indicating that the reaction was happening in the gas phase during the whole time. With respect to a previous report by Hu et al. where the nanowires length was limited to a maximum of 6 μm due to the limited diffusion of oxygen through the liquid etchant layer, the method of the present disclosure allows to etch nanowires with at least 17 times longer length. The Pt catalyst layer is still visible at the bottom of the SEM image of FIG. 8C, it looks flat indicating that it is still stable even after the long etching and exposure to heavily concentrated HF gas.

The stability of the catalyst indicates that the gas phase MacEtch can continue and produce even longer nanowires. Thus, FIG. 8 demonstrates the capability of the present invention to etch extremely deep trenches with huge aspect ratio (10000 to 1) in silicon with very high precision.

In another example, the etchant is obtained by evaporation of a liquid solution that contains water diluted HF and alcohol as additive. Alcohols with low vapor pressure and low surface tension is used as catalyst instead of water vapor in order to minimize the capillary force of the gas-liquid interface. The alcohol helps the vapor etching to proceed with smaller water condensation because it is highly volatile and tends to evaporate easily with water.

Figure 9:
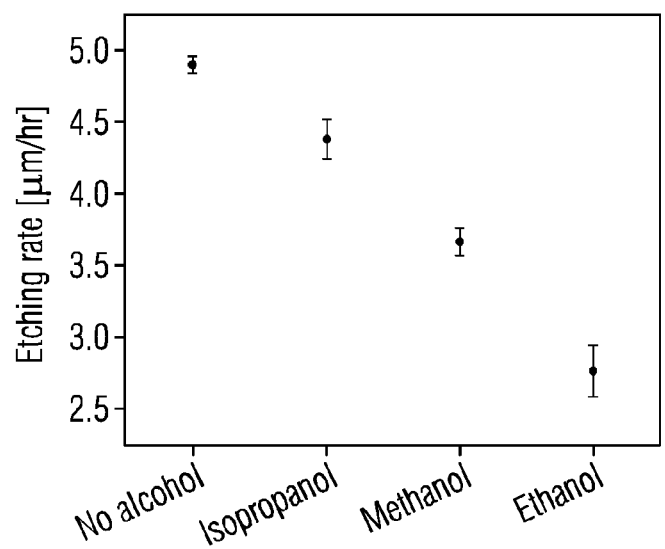
FIG. 9 shows the etching rate as a function of different alcohols in the liquid solution (A) and at different temperatures (B). The etchant evaporates from the liquid solution containing water diluted HF and alcohols, the oxidant is air. Examples of nanowires obtained in presence of Isopropanol at 40° C. (C) and 55° C. (D). SEM of nanowires showing the difference in etching depth at border of the metal pattern (E) and the reduction of nanowires length difference as a function of temperature and alcohol presence (F).
Figure 9:
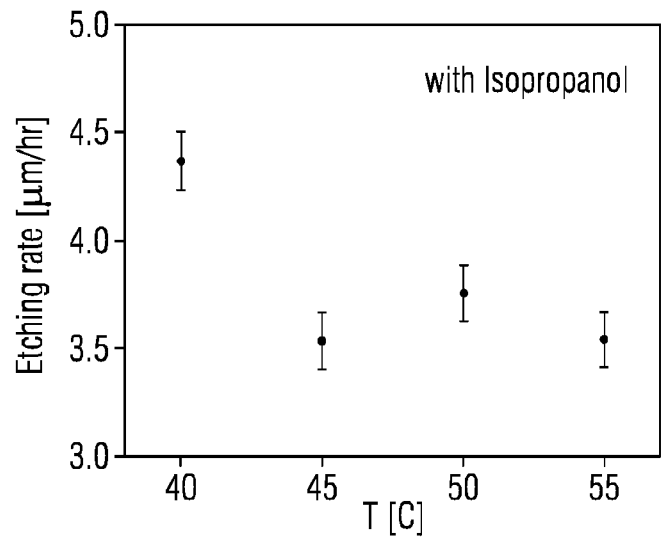
Figure 9:
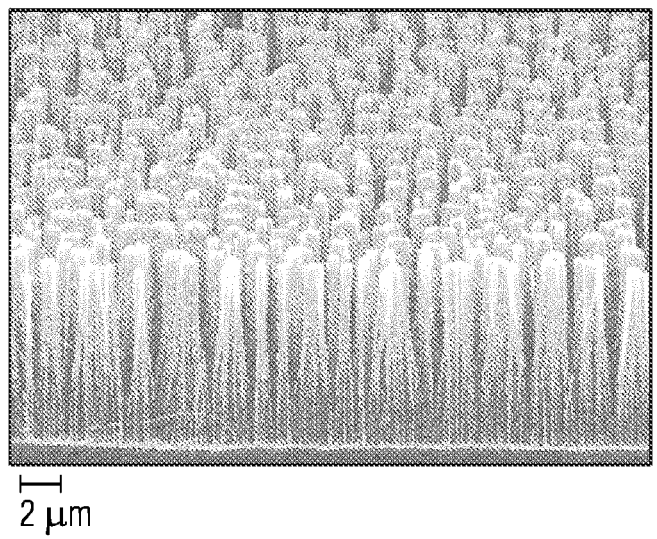
Figure 9:
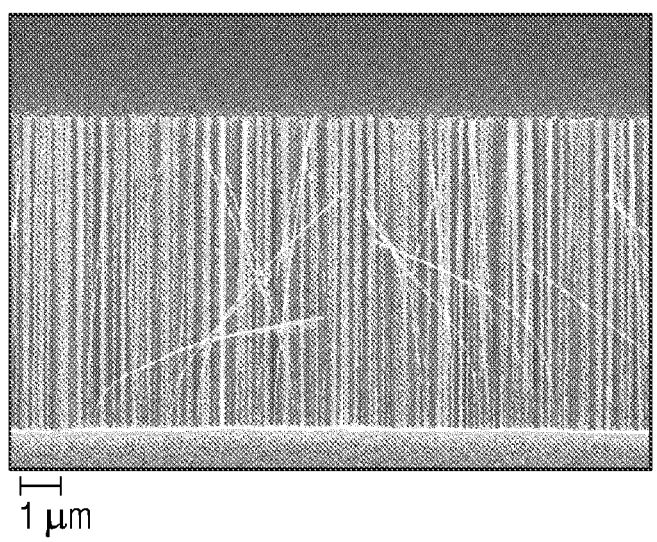
Figure 9:
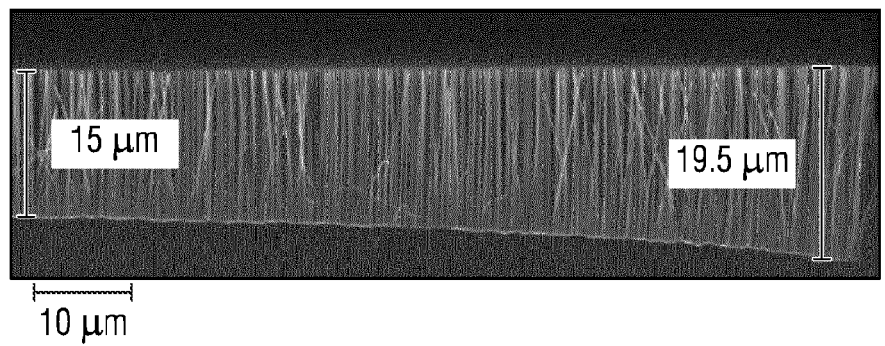

FIG. 9 reports the experimental results obtained with the setup of FIG. 3 and the use of methanol, isopropanol and ethanol as additive in the liquid solution containing water diluted HF. The samples are square of 1×1 cm$^2$ cleaved from a silicon substrate with platinum self-assembled mask of FIG. 6, the silicon substrate is N type <100> single crystal with resistivity in the range of 0.001 to 0.01 Ωcm. The liquid solution has an HF molar concentration in the range of 1 to 20 mol/l, the alcohol volume is in the range of 10 to 20% of the full liquid solution.

FIG. 9A shows the etching rate calculated by measuring the length of the nanowires produced at 40° C. in 2 hours with the system of FIG. 3. The etching rate decreases in presence of alcohols as reported in FIG. 9A. In this particular example, the etching rate has the highest value for isopropanol. FIG. 9B reports the SEM image of nanowires produced by adding isopropanol to the liquid solution containing water diluted HF and heating the substrate with the metal pattern thereon at 40° C. The liquid condensation causes the nanowires to form large bundles. The alcohol catalyzes the HF reaction by producing water as by-product so the thickness of the condensed layer increases with the alcohol content in the vapor.

The etching rate decreases as a function of the substrate temperature as reported in FIG. 9B. By rising the temperature up to 55° C., no nanowires bundles were detected.

FIG. 9D reports the SEM image of nanowires produced by adding isopropanol to the liquid solution containing water diluted HF and heating the substrate with the metal pattern thereon at 55° C. The nanowires of FIG. 9D have the same length of nanowires in FIG. 9C but they appear well separated. Thus, the heating temperature is a relevant parameter to avoid water condensation and nanostructures stiction in the method of the present disclosure. The etching proceeds with higher etching rate at the border of the pattern, an example of this effect is visible in FIG. 9E.

FIG. 9F shows the relative variation of the length (ΔL) of the nanowires between the center and the border of the sample as a function of the substrate temperature, the higher the temperature the smaller the ΔL. In presence of alcohol the reduction of ΔL is even more relevant. Therefore, the etching uniformity can be improved by increasing the heating temperature and in presence of alcohol.

Figure 10:
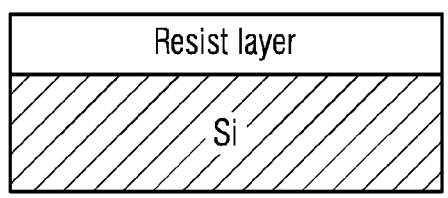
FIG. 10 schematically shows the process steps to realize an high aspect ratio pattern in a semiconductor substrate: a resist layer covers the semiconductor substrate (A); the pattern is exposed by a lithographic method (B) and developed (C); a thin metal layer is deposited (D) and the resist is lifted-off (E); a continuous mesh pattern with stabilizing metal-semiconductor alloy is formed by thermal treatment (F); the metal patterned layer is exposed to oxidant and etchant (G) and the etched structure is formed (H) with eventual residual nanowires.
Figure 10:
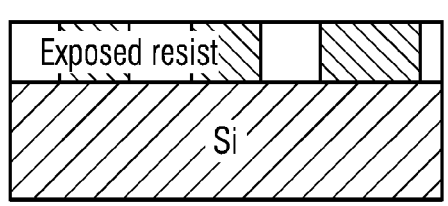
Figure 10:
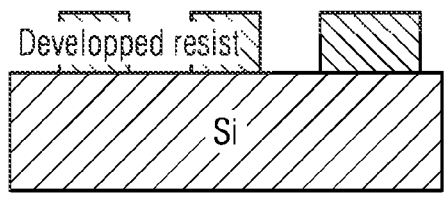
Figure 10:
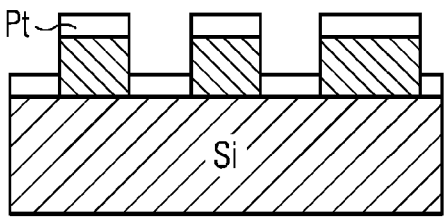
Figure 10:
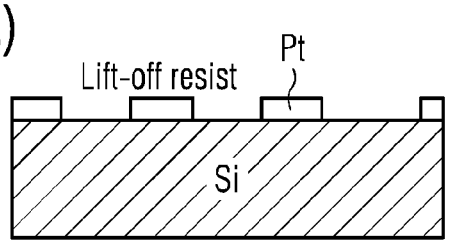
Figure 10:
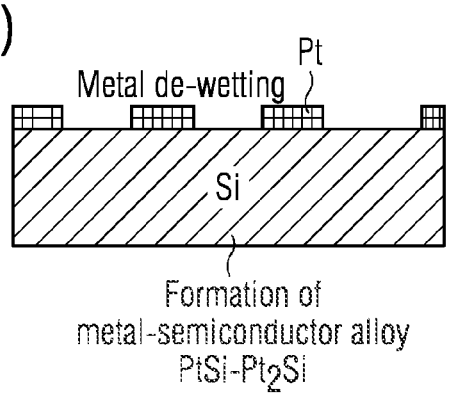
Figure 10:
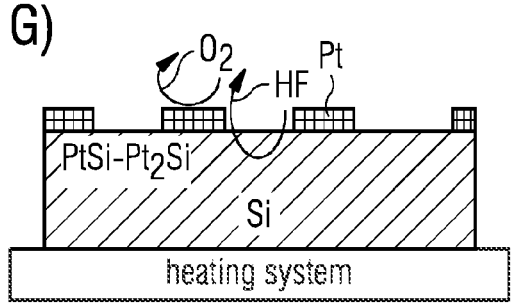
Figure 10:
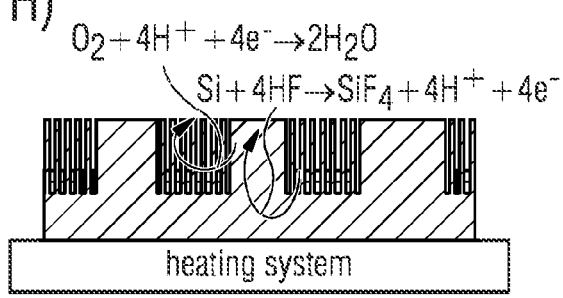

FIG. 10 shows a flow chart for fabricating photonic devices elements, such as diffractive gratings with the method of the present disclosure. In certain embodiments, the metal pattern is prepared by lithographic methods with positive resist on a silicon substrate. A proper resist coats the semiconductor substrate (FIG. 10A), the resist type and the thickness depend on the desired pattern.

In one example a positive photoresist MICROPOSIT™ S1805 was used for photolithography, according to a procedure reported elsewhere. In another example PMMA as positive resist was used for electron beam lithography. The resist is exposed to UV or e-beam lithography (FIG. 10B) and subsequently developed (FIG. 10C). A short plasma cleaning (10 to 60 s in a standard oxygen RF plasma etching) was used to clean the resist residual, the time was tuned to avoid an excessive thinning of the resist. In certain embodiment Pt was used as metal catalyst, Pt was deposited using an electron beam evaporator with a deposition rate of 0.5 nm/min. The Pt thickness was the range of 5 to 20 nm (FIG. 10D). Then, lift-off was performed (FIG. 10E), for example by dipping the sample in acetone. The sample was rinsed in clean solvent, then in isopropanol and dried by nitrogen blowing. The Pt film de-wetting and the Pt-silicide to stabilize the catalyst layer is obtained by annealing (FIG. 10F) on a hot plate in air in the temperature range of 250-600° C. The de-wetting step is relevant to ensure a uniform etching of metal patterns that have feature size in one direction bigger than 500 nm.

The metal de-wetting produces nanowires during MacEtch. The impact of etched nanowires on the final pattern can be minimized by tuning the metal film thickness and the annealing temperature in order to have nanowires with section size much smaller than the pattern feature size, such as in the examples of FIG. 6. In certain embodiments the MacEtch is performed by exposing the Si substrate and the Pt patterned layer with the stabilizing Pt silicide layer thereon to air and HF during the heating (FIG. 10G). The metal layer acts as catalyst. The oxidant selectively oxides region of the semiconductor substrate underneath the patterned metal layer and HF selectively removes the oxidized regions (FIG. 10H).

Accordingly, the metal covered regions of the semiconductor substrate are etched, inducing the patterned metal layer to sink into the semiconductor substrate (FIG. 10H). Thus, an etched semiconductor structure is formed.

Figure 11:
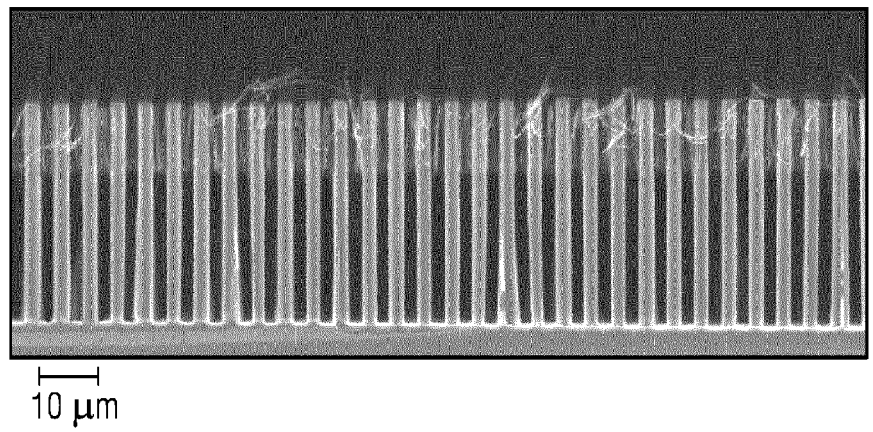
FIG. 11 shows some examples of high aspect ratio X-ray diffractive optical elements obtained by the present disclosure.
Figure 11:
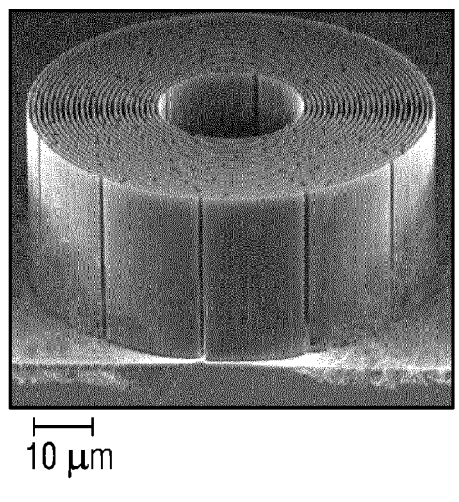
Figure 11:
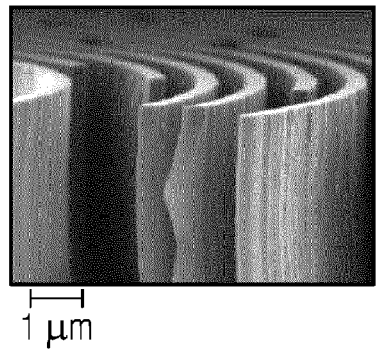
Figure 11:
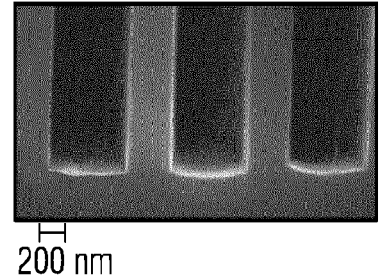

FIG. 11 shows some examples of gratings structures obtained by the procedure showed in FIG. 10. The metal layer was patterned by UV photolithography for the examples in FIG. 11A and by electron beam lithography for the examples in FIGS. 11B-D. FIG. 11A shows a linear grating with pitch size of 4.8 µm. The nanowires produced by the Pt de-wetting are visible in the SEM image but they have minimal X-ray absorption. FIG. 11B shows a circular grating with pitch size of 1 µm. Residuals of nanowires are visible in the Si trench due to the catalyst de-wetting. A depth of 29 µm was realized by heating the sample at 55° C. and exposing for 4 h in the system described in FIG. 3. The resulting aspect ratio is about 80:1. The smoothness of the etched Si lines is visible in the high resolution images of the grating from top (FIG. 11C) and bottom (FIG. 11D) views. The etching is very uniform on the whole patterned area as demonstrated by the uniform Moiré pattern visible in the SEM image (FIG. 11B).

FIG. 12 shows an example of linear grating with pitch size of 1 µm and silicon width of 300 nm, the metal pattern was produced by electron beam exposure of PMMA resist and Pt deposition. FIGS. 12A and 12B (B is high magnification detail of A) is a cross section SEM of the bottom of the etched structure by the method of present disclosure as described in FIG. 3. The etching was realized at 55° C. with air and etchant produced by evaporation of a liquid solution containing water diluted HF at a molar concentration in the range of 1-20 mol/l.

FIGS. 12C and 12D (D is high magnification detail of C) is a cross section SEM of the bottom of the etched structure by liquid phase MacEtch, the liquid solution contains water diluted HF in a molar concentration of in the range of 1-5 mol/l and $H_2O_2$ in a molar concentration of 0.5-2 mol/l. FIG. 12 is meant to show the Si porosity of structures realized by MacEtch in gas phase in comparison to liquid phase for Si N type <100> single crystal with resistivity in the range of 0.001-0.01 Ωcm. In gas phase (FIG. 12A-B) the etched Si structure has the same contrast of bulk Si (below the catalyst), few nanowires are visible on the catalyst layer. A plurality of small pores are visible by SEM in the structure produced by liquid phase MacEtch (FIG. 12C-D). Moreover, a characteristic distribution of pores is observed at the bottom of the etched structures (FIG. 12C-D), the pores are so many that they look like a full mesoporous structure, the non-etched bulk Si is clearly visible at the bottom of the image. The mesoporous Si has a poorer contrast in SEM in comparison to bulk non-etched Si regions. The mesoporous structure starts at the interface with non-etched bulk Si substrate with a characteristic inverted V shape in proximity of the Pt catalyst layer.

RELEVANT PRIOR ART

Y. Hu, K.-Q. Peng, Z. Qiao, X. Huang, F.-Q. Zhang, R.-N. Sun, X.-M. Meng & S.-T. Lee, Metal-Catalyzed Electroless Etching of Silicon in Aerated HF/H2O Vapor for Facile Fabrication of Silicon Nanostructures, Nano Letters 14 (2014) 4212-4219.

O. J. Hildreth & D. R. Schmidt, Vapor Phase Metal-Assisted Chemical Etching of Silicon, Advanced Functional Materials 24 (2014) 3827-3833.

Catalyst assisted chemical etching with a vapor phase etchant according to US 2018/0090336 A1.

The invention claimed is:

1. A method for fabricating photonic device elements by means of metal assisted chemical etching in gas phase, the method comprising the following steps:
   (a) providing a semiconductor substrate and a patterned metal layer on the semiconductor substrate;
   (b) exposing the semiconductor substrate and the patterned metal layer to reactants in gas phase, the reactants including an oxidant gas and an etchant gas;
   the oxidant gas comprising air and the etchant gas comprising hydrofluoric acid;
   supplying the reactants in a continuous or pulsed flow to the semiconductor substrate and the patterned metal layer on the semiconductor substrate;
   locally increasing a concentration of oxygen in the oxidant gas by decomposing $H_2O_2$ on a platinum surface, being a solid piece containing platinum immersed in a liquid solution containing $H_2O_2$, with a decomposition of $H_2O_2$ in the liquid phase on the platinum surface producing $O_2$ in gas phase; and
   wherein the liquid solution is placed in a container and the liquid is not in contact with the semiconductor substrate and the patterned metal on the semiconductor substrate.

2. The method according to claim 1, wherein the etchant comprises hydrofluoric acid (HF) in vapor phase as evaporated from a liquid solution containing water diluted HF.

3. The method according to claim 1, wherein the semiconductor substrate contains a semiconductor selected from the group consisting of: Si, Ge, or an alloy containing elements from groups III and V in the periodic table and wherein the patterned metal layer contains a metal selected from the group consisting of: Au, Ag, Pt, Pd, Cu, Ni, Rh.

4. The method according to claim 1, which comprises heating the semiconductor substrate and the patterned metal layer thereon to a temperature in a range from 30° C. to 90° C. during the step of exposing to the oxidant gas and the etchant.

5. The method according to claim 1, which comprises carrying out the method in presence of an inert gas selected from the group consisting of nitrogen, argon, and helium.

6. The method according to claim 1, which comprises carrying out the method in the presence of an alcohol selected from the group consisting of isopropanol, methanol, and ethanol.

7. The method according to claim 1, which comprises supplying the etchant gas to an enclosed etching chamber by way of a dedicated gas line.

8. The method according to claim 1, wherein the patterned metal layer comprises a continuous mesh pattern, and the etched semiconductor structure comprises an array of nanowires with an aspect ratio of at least 10:1.

9. The method according to claim 1, wherein the patterned metal layer comprises an X-ray diffractive grating pattern with periodic features, and the etched semiconductor structure comprises an X-ray diffractive grating with periodic features.

* * * * *